United States Patent
Hsieh et al.

(10) Patent No.: US 7,326,967 B2
(45) Date of Patent: Feb. 5, 2008

(54) LIGHT EMITTING DIODE HAVING AN OMNIDIRECTIONAL REFLECTOR INCLUDING A TRANSPARENT CONDUCTIVE LAYER

(75) Inventors: Min-Hsun Hsieh, Hsin-Chu (TW); Ching-San Tao, Hsin-Chu (TW); Tzu-Feng Tseng, Hsin-Chu (TW); Jr-Peng Ni, Hsin-Chu (TW)

(73) Assignee: Epistar Corporation, Hsin-chu (TW)

( * ) Notice: Subject to any disclaimer, the term of this patent is extended or adjusted under 35 U.S.C. 154(b) by 234 days.

(21) Appl. No.: 11/160,773

(22) Filed: Jul. 8, 2005
(Under 37 CFR 1.47)

(65) Prior Publication Data
US 2006/0006402 A1    Jan. 12, 2006

(30) Foreign Application Priority Data
Jul. 12, 2004    (TW) .............. 93120854 A

(51) Int. Cl.
*H01L 33/00*    (2006.01)
(52) U.S. Cl. ............. 257/98; 257/103; 257/E33.064; 257/E33.068; 257/91
(58) Field of Classification Search ........... 257/98, 257/91, 103, E33.064, E33.068
See application file for complete search history.

(56) References Cited

U.S. PATENT DOCUMENTS

| 6,784,462 | B2 * | 8/2004 | Schubert ................ 257/98 |
| 7,078,735 | B2 * | 7/2006 | Shono et al. ............ 257/98 |
| 7,148,517 | B2 * | 12/2006 | Tu et al. ................ 257/96 |
| 7,154,121 | B2 * | 12/2006 | Hsieh et al. ............ 257/79 |
| 2003/0111667 | A1 | 6/2003 | Schubert |
| 2003/0164503 | A1 * | 9/2003 | Chen ..................... 257/79 |
| 2005/0110037 | A1 * | 5/2005 | Takeda et al. ......... 257/103 |
| 2005/0208691 | A1 * | 9/2005 | Shei et al. ............. 438/29 |
| 2005/0242358 | A1 * | 11/2005 | Tu et al. ............... 257/98 |
| 2005/0253129 | A1 * | 11/2005 | Tsai et al. ............. 257/13 |

* cited by examiner

*Primary Examiner*—Evan Pert
*Assistant Examiner*—Victor A. Mandala, Jr.
(74) *Attorney, Agent, or Firm*—Quintero Law Office

(57) ABSTRACT

The present invention is related to a light emitting diode of an omnidirectional reflector providing with a transparent conductive layer. In the present invention, a cohesion layer is formed between a transparent layer and a metal reflection layer to improve the cohesive force therebetween and increase the reflectivity of the light emitting diode, so as the present invention can enhance the light-emitting efficiency of the light emitting diode.

30 Claims, 6 Drawing Sheets

LIGHT EMITTING DIODE HAVING AN OMNIDIRECTIONAL REFLECTOR INCLUDING A TRANSPARENT CONDUCTIVE LAYER

BACKGROUND OF THE INVENTION

1. Field of the Invention

The invention relates to a light-emitting diode having an omnidirectional reflector (ODR), and more particularly, to a light-emitting diode having an omnidirectional reflector including a transparent conductive layer.

2. Description of the Related Art

LEDs have broad applications. For example, LEDs can be utilized in optical displays, traffic signs, data storage devices, communication devices, lighting devices, and medical devices. Therefore, the luminance and lighting efficiency of an LED has become an important consideration in LED production.

In Proc. SPIE Int. Soc. Opt. Eng. 4996 139 (2003) of Gessmann, an LED having an omnidirectional reflector and its producing method is disclosed. A GaN LED stack is formed on a sapphire substrate, an ITO transparent conductive layer is formed on the GaN LED stack, and an Ag layer is formed on the ITO transparent conductive layer. A GaN/ITO/Ag ODR-LED structure is therefore formed. The GaN/ITO/Ag ODR-LED structure can have a better light reflectivity than that of a prior art GaN LED structure having Ni—Au current distributing layers, thereby achieving good luminance. However, because the Ag layer cannot well bond to the ITO layer by cohesion, the GaN/ITO/Ag ODR-LED structure may suffer from peeling. In addition, because the reflectivity of the GaN/ITO/Ag ODR-LED relating to a short wavelength of blue light is low, the luminance of the GaN/ITO/Ag ODR-LED cannot efficiently be raised.

In a prior art GaN/ITO/Ag ODR-LED, a Cr layer is formed between the ITO layer and Ag layer in order to enhance the bonding between the ITO layer and Ag layer. However, because Cr has the characteristics of light absorption and low reflectivity, the luminance of the ODR-LED cannot be high.

SUMMARY OF THE INVENTION

As mentioned above, in the prior art, the ITO layer and the Ag layer does not bond well by cohesion in the ODR-LED. The reflectivity is low in the blue-light short wavelength of the ODR-LED, and the luminance in the blue-light short wavelength of the ODR-LED cannot be raised efficiently in the prior art. Furthermore, ITO/Cr/Ag or ITO/Cr/Al LEDs have the disadvantages of light-absorption, low reflectivity, and low luminance.

Therefore, one aspect of the present invention is to solve the problem of the low luminance of the prior art ITO/Cr/Ag or ITO/Cr/Al LED. Another aspect of the present invention is to improve the cohesion characteristic between the ITO layer and the Ag layer of the ODR-LED. The third aspect of the present invention is to improve the reflectivity in the blue-light short wavelength of the ODR-LED. Therefore, the present invention provides a concept for improving the luminance of the LED.

In order to solve the above-mentioned problems, the inventors of the present invention disclose an invention concept: if a cohesion layer is formed between the ITO layer and the Ag layer of the GaN/ITO/Ag ODR-LED, and the cohesive force between the cohesion layer and the transparent conductive layer and between the cohesion layer and the metal layer, respectively, are both better than the cohesive force between the ITO layer and the Ag layer, the disadvantage of low cohesion characteristic is improved. This can make the ODR-LED have higher reflectivity than that of a prior art ODR-LED having an Ni—Au current distribution layer. Therefore, this can efficiently raise the luminance of the LED.

In order to achieve the above-mentioned objectives, the present invention discloses an LED having an omnidirectional reflector including a transparent conductive layer. The LED comprises a substrate, an adhesive layer formed on the substrate, a metal reflection layer formed on the adhesive layer, a cohesion layer formed on the metal reflection layer, and a transparent conductive layer formed on the cohesion layer, wherein the upper layer of the transparent layer comprises a first surface area and a second surface area. The LED further comprises a first contact layer formed on the first surface area, a first cladding layer formed on the first contact layer, a light-emitting layer formed on the first cladding layer, a second cladding layer formed on the light-emitting layer, a second contact layer formed on the second cladding layer, a first wire electrode formed on the second contact layer, and a second wire electrode formed on the second surface area of the transparent conductive layer. Furthermore, a reaction layer can be formed between the substrate and the adhesive layer or formed between the adhesive layer and the metal reflection layer. Alternatively, two reaction layers can be formed respectively between the substrate and the adhesive layer and between the adhesive layer and the metal reflection layer. This can raise the cohesive force.

The above-mentioned substrate is made of at least one material selected from the group consisting of GaAs, AlGaAs, GaAsP, GaP, Si, SiC, metals, sapphire, GaN, AlN, ZnO, MgO, glass, and alternative replaceable materials.

The above-mentioned adhesive layer is made of at least one material selected from the group consisting of Pl, BCB, PFCB, and alternative replaceable materials.

The above-mentioned metal reflection layer is made of at least one material selected from the group consisting of Al and Ag.

The above-mentioned cohesion layer is made of at least one material selected from the group consisting of SiNx, $SiO_2$, SiO, $TiO_2$, $Al_2O_3$ and alternative replaceable materials.

The above-mentioned transparent conductive layer is made of at least one material selected from the group consisting of Tin Indium Oxide, Tin Cadmium Oxide, Tin Antimony Oxide, Zinc Oxide, or Tin Zinc Oxide.

The above-mentioned first contact layer is made of at least one material selected from the group consisting of GaP, GaAs, GaAsP, AlGaInP, GaN, InGaN, and AlGaN.

The above-mentioned first cladding layer is made of at least one material selected from the group consisting of AlGaInP, AlInP, AlN, GaN, AlGaN, InGaN, and AlGaInN.

The above-mentioned light-emitting layer is made of at least one material selected from the group consisting of AlGaInP, InGaP, GaN, AlGaN, InGaN, and AlGaInN.

The above-mentioned second cladding layer is made of at least one material selected from the group consisting of AlGaInP, AlInP, AlN, GaN, AlGaN, InGaN, and AlGaInN.

The above-mentioned second contact layer is made of at least one material selected from the group consisting of GaP, GaAs, GaAsP, InGaP, AlGaInP, AlGaAs, GaN, InGaN, and AlGaN.

The above-mentioned reaction layer is made of at least one material selected from the group consisting of SiNx, Ti, and Cr.

FIG. 1 is a diagram illustrating a relationship between reflectivity and wavelength of an ITO/Al or ITO/Ag ODR-LED. As shown in FIG. 1, the LED has lower reflectivity in blue-light short wavelength. In a wavelength of 445 nm, the reflectivity is between 0.53 and 0.65. Therefore, the prior art ITO/Al or ITO/Ag ODR-LED has a disadvantage of bad luminance in the blue-light short wavelength.

FIG. 2 is a diagram illustrating a relationship between reflectivity and wavelength of an ITO/Cr/Ag or ITO/Cr/Al LED. As shown in FIG. 2, the reflectivity is lower than that of the above-mentioned ITO/Al or ITO/Ag ODR-LED. In the wavelength 445 nm, the reflectivity is between 0.27 and 0.58. The light-emitting efficiency is worse.

FIG. 3 is a diagram illustrating a relationship between the reflectivity and the wavelength of an ITO/cohesion layer/Al and ITO/cohesion layer/Ag ODR-LED providing with a transparent conductive layer. As shown in FIG. 3, in the wavelength 445 nm, the reflectivity is between 0.79 and 0.94. Even in the wavelength 430 nm, the lowest reflectivity is between 0.75 and 0.90. It can be seen that the reflectivity is bigger than that of the ITO/Cr/Ag or ITO/Cr/Al LED or ITO/Al or ITO/Ag ODR-LED. Furthermore, even in the blue-light short wavelength, the reflectivity does not decrease apparently. Therefore, the prior art problems of bad reflectivity and bad luminance are improved in the blue-light short wavelength.

These and other objects of the present invention will no doubt become obvious to those of ordinary skill in the art after reading the following detailed description of the preferred embodiments that are illustrated in the accompanying drawings.

DETAILED DESCRIPTION OF THE INVENTION

Embodiment 1

Figure 1:
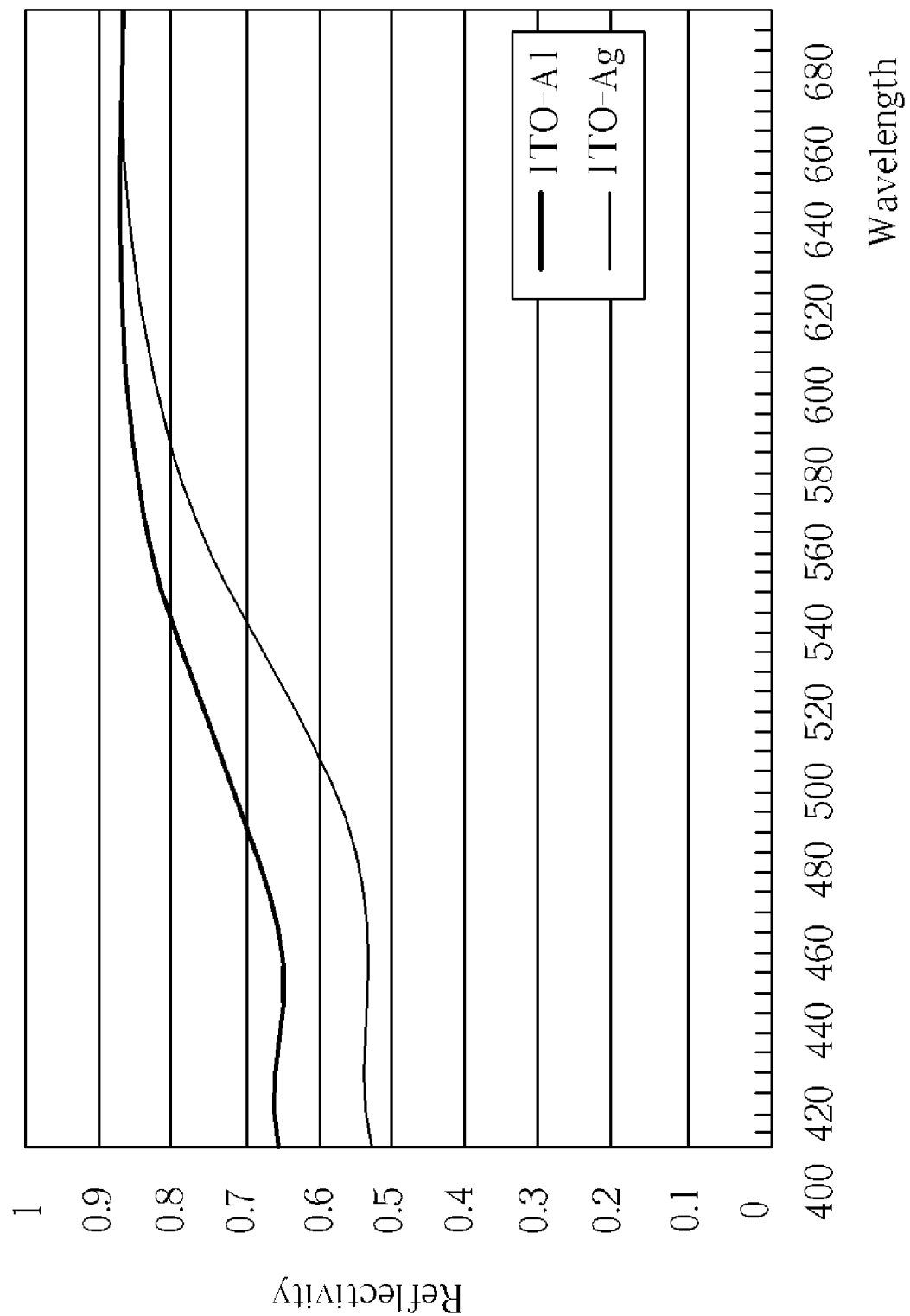
FIG. 1 is a diagram illustrating a relationship between reflectivity and wavelength of an ITO/Al or ITO/Ag ODR-LED.
Figure 2:
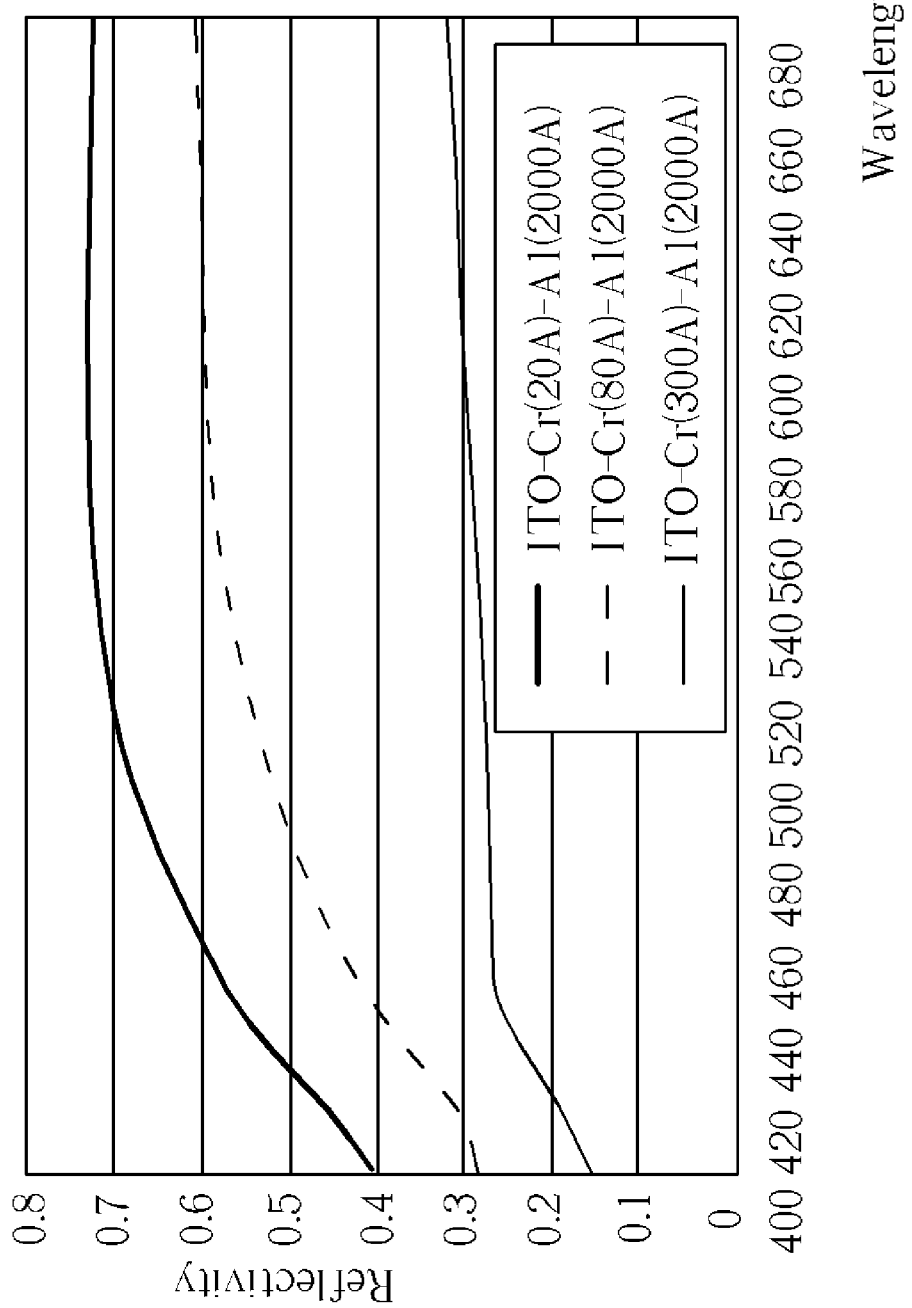
FIG. 2 is a diagram illustrating a relationship between reflectivity and wavelength of an ITO/Cr/Ag or ITO/Cr/Al LED.
Figure 3:
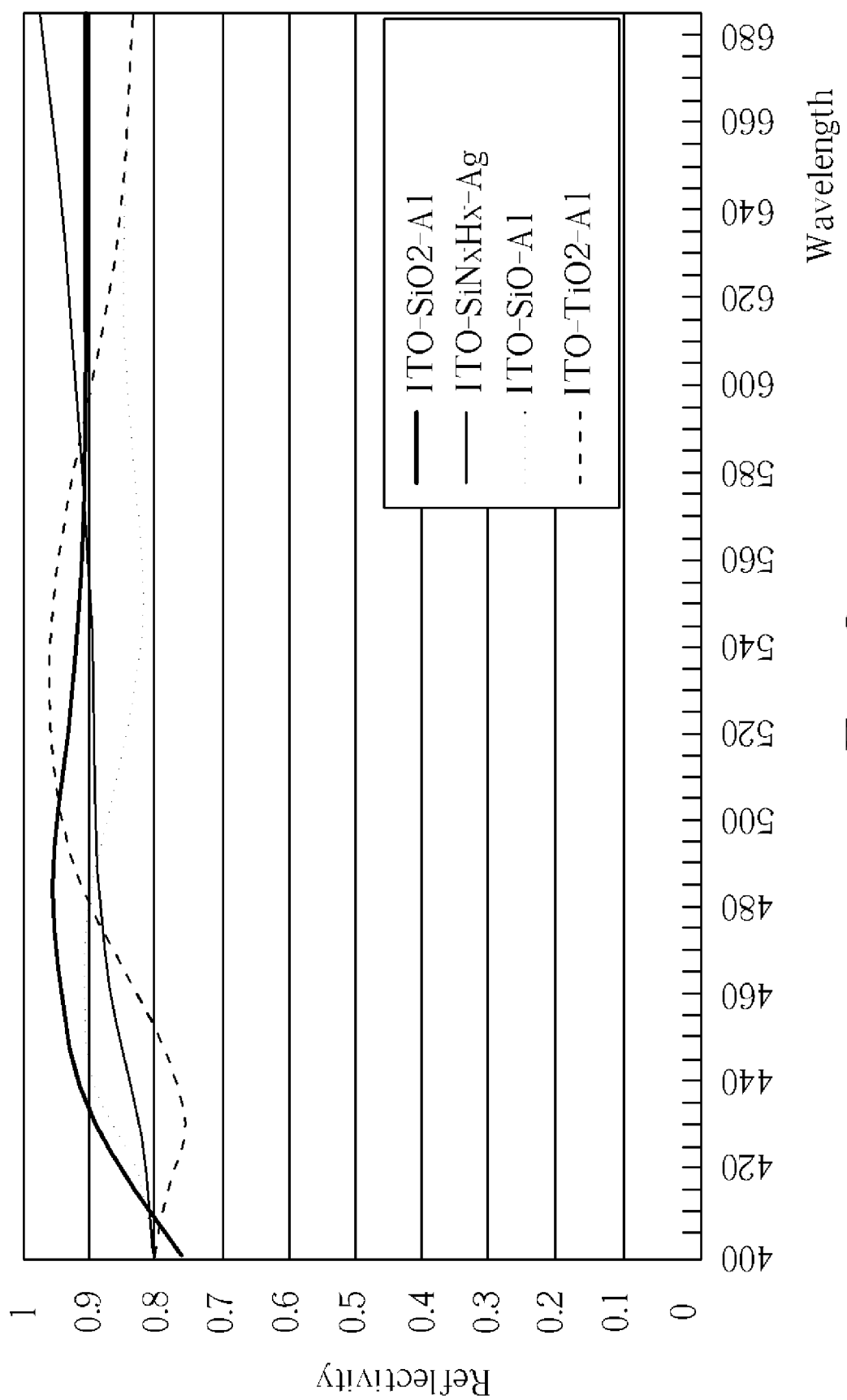
FIG. 3 is a diagram illustrating a relationship between reflectivity and wavelength of an ITO/cohesion layer/Al and ITO/cohesion layer/Ag ODR-LED providing with a transparent conductive layer.
Figure 4:
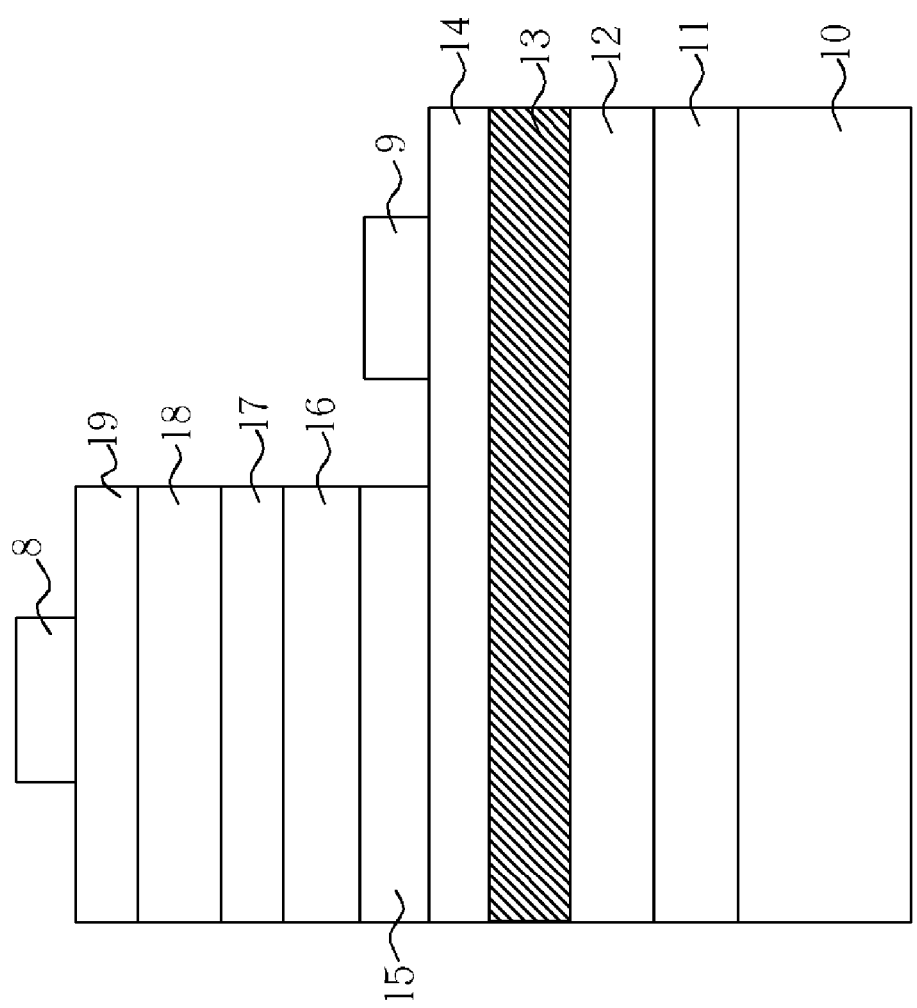
FIG. 4 is a diagram of an embodiment of an LED of an omnidirectional reflector providing with a transparent conductive layer according to the present invention.

Please refer to FIG. 4, which is a diagram of an embodiment of an LED of an omnidirectional reflector providing with a transparent conductive layer according to the present invention. The LED comprises a substrate 10, an adhesive layer 11 formed on the substrate 10, a metal reflection layer 12 formed on the adhesive layer 11, a cohesion layer 13 formed on the metal reflection layer 12, a transparent conductive layer 14 formed on the cohesion layer 13, wherein the upper surface of the transparent layer 14 comprises a first surface area and a second surface area. The LED further comprises a first contact layer 15 formed on the first surface area, a first cladding layer 16 formed on the first contact layer 15, a light-emitting layer 17 formed on the first cladding layer 16, a second cladding layer 18 formed on the light-emitting layer 17, a second contact layer 19 formed on the second cladding layer 18, a first wire electrode 8 formed on the second contact layer 19, and a second wire electrode 9 formed on the second surface area of the transparent layer 14.

Embodiment 2

Figure 5:
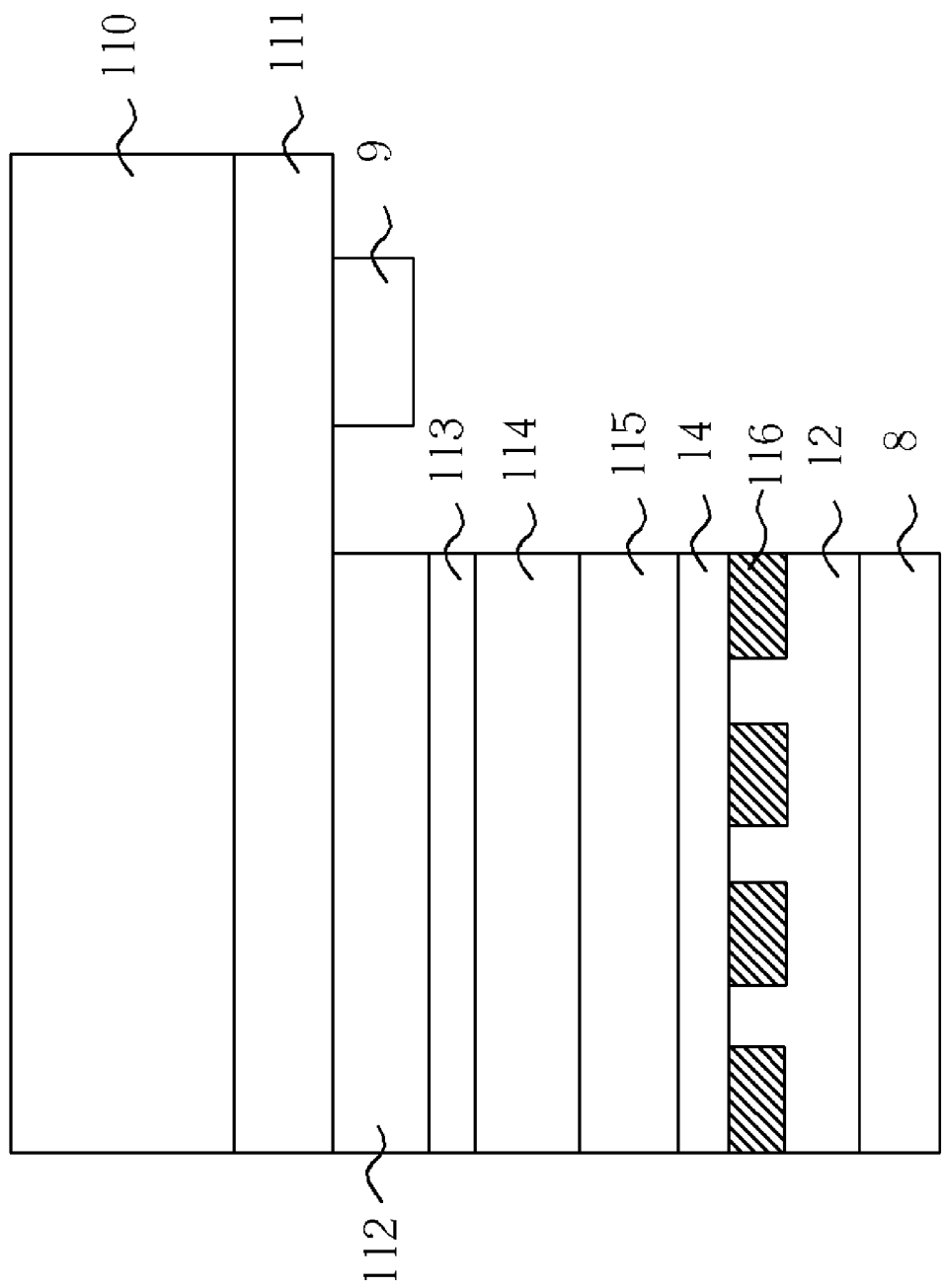
FIG. 5 is a diagram of another embodiment of a flip-chip LED of an omnidirectional reflector providing a transparent conductive layer according to the present invention.

Please refer to FIG. 5, which is a diagram of another embodiment of a flip-chip LED of an omnidirectional reflector providing with a transparent conductive layer according to the present invention. The flip-chip LED comprises a transparent substrate 110, a first contact layer 111 formed below the transparent substrate 110, wherein the bottom surface of the first contact layer 111 comprises a first surface area and a second surface area. The flip-chip LED further comprises a first cladding layer 112 formed below the first surface area of the first contact layer 111, a light-emitting layer 113 formed below the first cladding layer 112, a second cladding layer 114 formed below the light-emitting layer 113, a second contact layer 115 below the second cladding layer 114, a transparent conductive layer 14 formed below the second contact layer 114, a cohesion layer 116 having a distributed geometrical pattern formed below the transparent conductive layer 14, a metal reflection layer 12 formed below the cohesion layer 116, a first wire electrode 8 formed below the metal reflection layer 12, and a second wire electrode 9 formed below the second surface area of the first contact layer 111.

Embodiment 3

Figure 6:
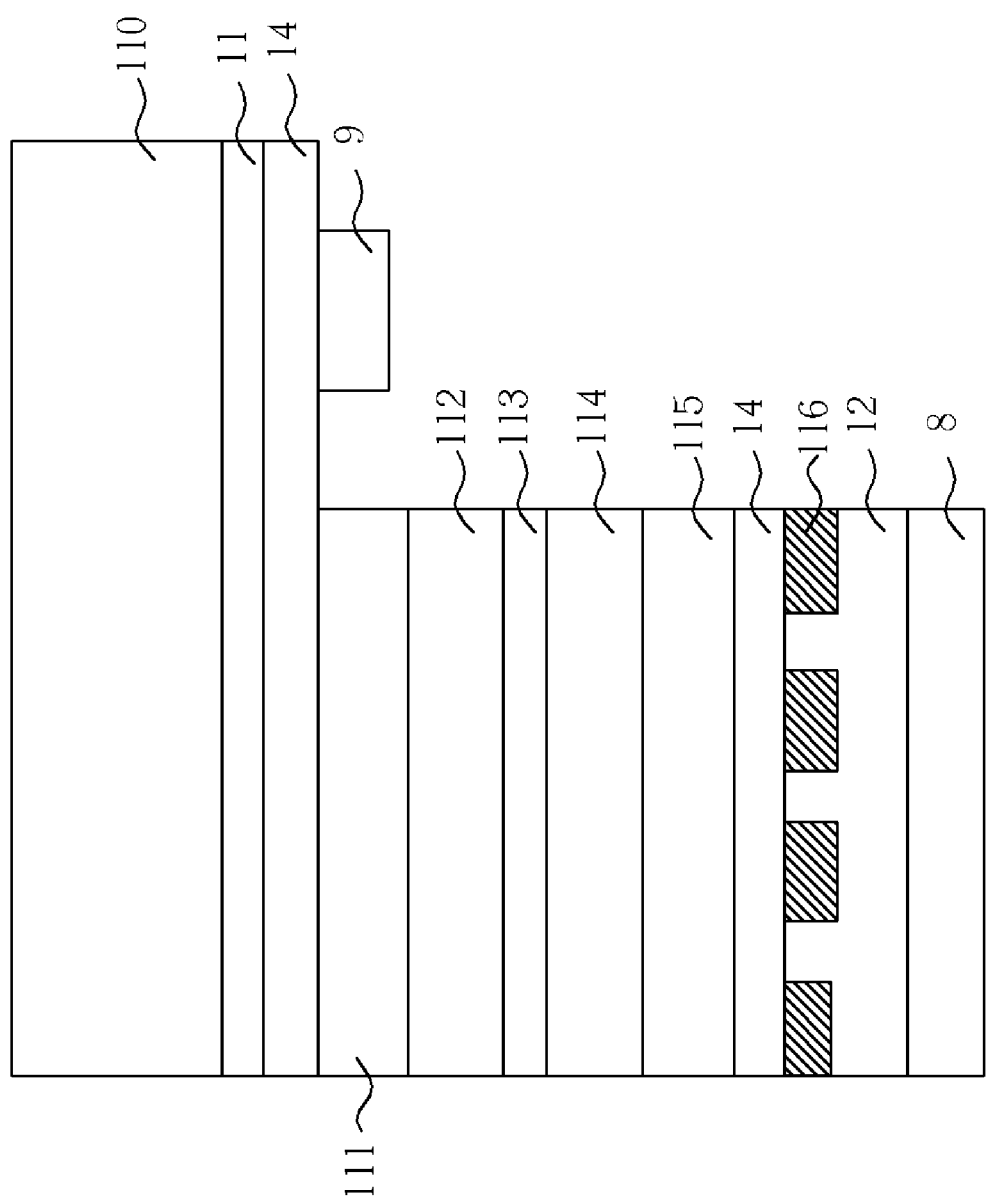
FIG. 6 is a diagram of the other embodiment of a flip-chip LED of an omnidirectional reflector providing with a transparent conductive layer according to the present invention.

Please refer to FIG. 6, which is a diagram of the other embodiment of a flip-chip LED having an omnidirectional reflector and a transparent conductive layer according to the present invention. In this embodiment, the flip-chip LED is similar to that of the above-mentioned embodiment. The difference between them is that the above-mentioned transparent substrate is a combination of a transparent substrate and an adhesive layer. In this embodiment, the flip-chip LED comprises a transparent substrate 110, an adhesive layer 111 formed below the transparent substrate 110, and a transparent conductive layer 14 formed below the adhesive layer 11, wherein the bottom surface of the transparent conductive layer 14 comprises a first surface area and a second surface area. The flip-chip LED further comprises a first contact layer 111 formed below the first surface area of the transparent conductive layer 14, a first cladding layer 112 formed below the first contact layer 111, a light-emitting layer 113 formed below the first cladding layer 112, a second cladding layer 114 formed below the light-emitting layer 113, a second contact layer 115 formed below the second cladding layer 114, a transparent conductive layer 14 formed below the second contact layer 115, a cohesion layer 116 having a distributed geometrical pattern formed below the transparent conductive layer 14, a metal reflection layer 12 formed below the cohesion layer 116, a first wire electrode 8 formed below the metal reflection layer 12, and a second wire electrode 9 formed below the second surface area of the transparent conductive layer 14.

The above-mentioned substrate is made of at least one material selected from the group consisting of GaAs, AlGaAs, GaAsP, GaP, Si, SiC, metals, sapphire, GaN, AlN, ZnO, MgO, glass, and other replaceable materials.

The above-mentioned transparent substrate is made of at least one material selected from the group consisting of GaP, SiC, sapphire, GaN, ZnO, MgO, and other replaceable materials.

The above-mentioned adhesive layer is made of at least one material selected from the group consisting of Pi, BCB, PFCB, and other replaceable materials.

The above-mentioned metal reflection layer is made of at least one material selected from the group consisting of Al and Ag.

The above-mentioned cohesion layer is made of at least one material selected from the group consisting of $SiN_x$, $SiO_2$, SiO, $TiO_2$, $Al_2O_3$ and alternative materials.

The above-mentioned transparent conductive layer is made of at least one material selected from the group consisting of Tin Indium Oxide, Tin Cadmium Oxide, Tin Antimony Oxide, Zinc Oxide, and Tin Zinc Oxide.

The above-mentioned first contact layer is made of at least one material selected from the group consisting of GaP, GaAs, GaAsP, AlGaInP, GaN, InGaN, and AlGaN.

The above-mentioned first cladding layer is made of at least one material selected from the group consisting of AlGaInP, AlInP, AlN, GaN, AlGaN, InGaN, and AlGaInN.

The above-mentioned light-emitting layer is made of at least one material selected from the group consisting of AlGaInP, InGaP, GaN, AlGaN, InGaN, and AlGaInN.

The above-mentioned second cladding layer is made of at least one material selected from the group consisting of AlGaInP, AlInP, AlN, GaN, AlGaN, InGaN, and AlGaInN.

The above-mentioned second contact layer is made of at least one material selected from the group consisting ofomprises GaP, GaAs, GaAsP, InGaP, AlGaInP, AlGaAs, GaN, InGaN, and AlGaN.

The above-mentioned first contact layer is made of at least one material selected from the group consisting of GaP, GaAs, GaAsP, AlGaInP, GaN, InGaN, and AlGaN.

The above-mentioned first cladding layer is made of at least one material selected from the group consisting of AlN, GaN, AlGaN, InGaN, and AlGaInN.

The above-mentioned light-emitting layer is made of at least one material selected from the group consisting of GaN, AlGaN, InGaN, and AlGaInN.

The above-mentioned second cladding layer is made of at least one material selected from the group consisting of AlN, GaN, AlGaN, InGaN, and AlGaInN.

The above-mentioned second contact layer is made of at least one material selected from the group consisting of GaN, InGaN and AlGaN.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting diode having an omnidirectional reflector, comprising:
    a substrate;
    a metal reflection layer;
    a cohesion layer formed on the metal reflection layer;
    a transparent conductive layer formed on the cohesion layer;
    an LED stack formed on the transparent conductive layer; and
    an adhesive layer formed between the substrate and metal reflection layer.

2. The light-emitting diode of claim 1 further comprising:
    a reaction layer formed between the substrate and the adhesive layer or between the adhesive layer and the metal reflection layer.

3. The light-emitting diode of claim 2 wherein the reaction layer is made of at least one material selected from the group consisting of $SiN_x$, Ti, and Cr.

4. The light-emitting diode of claim 1 further comprising:
    a first reaction layer formed between the substrate and the adhesive layer and a second reaction layer formed between the adhesive layer and the metal reflection layer.

5. The light-emitting diode of claim 4, wherein the first or second reaction layer is made of at least one material selected from the group consisting of $SiN_x$, Ti, and Cr.

6. The light-emitting diode of claim 1 further comprising:
    a transparent conductive layer formed on the LED stack.

7. The light-emitting diode of claim 6, wherein the transparent conductive layer is made of at least one material selected from the group consisting of Tin Indium Oxide, Tin Cadmium Oxide, Tin Antimony Oxide, Zinc Oxide, and Tin Zinc Oxide.

8. The light-emitting diode of claim 1, wherein the transparent conductive layer is made of at least one material selected from the group consisting of s Tin Indium Oxide, Tin Cadmium Oxide, Tin Antimony Oxide, Zinc Oxide, and Tin Zinc Oxide.

9. The light-emitting diode of claim 1, wherein the cohesion layer is made of at least one material selected from the group consisting of $SiN_x$, $SiO_2$, SiO, $TiO_2$, $Al_2O_3$, and the like.

10. The light-emitting diode of claim 1, wherein the metal reflection layer is made of at least one material selected from the group consisting of Al and Ag.

11. The light-emitting diode of claim 1, wherein the substrate is made of at least one material selected from the group consisting of GaAs, AlGaAs, GaAsP, GaP, Si, SiC, metals, sapphire, GaN, AlN, ZnO, MgO, glass, and the like.

12. The light-emitting diode of claim 1, wherein the adhesive layer is made of at least one material selected from the group consisting of Pi, BCB, PFCB, and the like.

13. The light-emitting diode of claim 1, wherein the LED stack comprises:
    a first contact layer;
    a first cladding layer formed on the first contact layer;
    a light-emitting layer formed on the first cladding layer;
    a second cladding layer formed on the light-emitting layer; and
    a second contact layer formed on the second cladding layer.

14. The light-emitting diode of claim 13, wherein the first contact layer is made of at least one material selected from the group consisting of GaP, GaAs, GaAsP, AlGaInP, GaN, InGaN, and AlGaN.

15. The light-emitting diode of claim 13, wherein the first cladding layer is made of at least one material selected from the group consisting of AlGaInP, AlInP, AlN, GaN, AlGaN, InGaN, and AlGaInN.

16. The light-emitting diode of claim 13, wherein the light-emitting layer is made of at least one material selected from the group consisting of AlGaInP, InGaP, GaN, AlGaN, InGaN, and AlGaInN.

17. The light-emitting diode of claim 13, wherein the second cladding layer is made of at least one material selected from the group consisting of AlGaInP, AlInP, AlN, GaN, AlGaN, InGaN, and AlGaInN.

18. The light-emitting diode of claim 13, wherein the second contact layer is made of at least one material selected from the group consisting of GaP, GaAs, GaAsP, InGaP, AlGaInP, AlGaAs, GaN, InGaN, and AlGaN.

19. A flip-chip light-emitting diode having an omnidirectional reflector providing, comprising:
  a transparent substrate optionally including an adhesive layer;
  an LED stack formed below the transparent substrate;
  a transparent conductive layer formed below the LED stack;
  a cohesion layer having a distributed geometrical pattern thereon and formed below the transparent conductive layer; and
  a metal reflection layer formed below the cohesion layer.

20. The light-emitting diode of claim 19, wherein the transparent conductive layer is made of at least one material selected from the group consisting of s Tin Indium Oxide, Tin Cadmium Oxide, Tin Antimony Oxide, Zinc Oxide, and Tin Zinc Oxide.

21. The light-emitting diode of claim 19, wherein the cohesion layer is made of at least one material selected from the group consisting of SiNx, $SiO_2$, SiO, $TiO_2$, $Al_2O_3$ and the like.

22. The light-emitting diode of claim 19, wherein the metal reflection layer is made of at least one material selected from the group consisting of Al and Ag.

23. The light-emitting diode of claim 19, wherein the transparent substrate is made of at least one material selected from the group consisting of GaP, SiC, sapphire, GaN, ZnO, MgO, and the like.

24. The light-emitting diode of claim 19, wherein the adhesive layer is made of at least one material selected from the group consisting of Pi, BCB, PFCB, and the like.

25. The light-emitting diode of claim 19, wherein the LED stack comprises:
  a first contact layer;
  a first cladding layer formed on the first contact layer;
  a light-emitting layer formed on the first cladding layer;
  a second cladding layer formed on the light-emitting layer; and
  a second contact layer formed on the second cladding layer.

26. The light-emitting diode of claim 25, wherein the first contact layer is made of at least one material selected from the group consisting of GaP, GaAs, GaAsP, AlGaInP, GaN, InGaN, and AlGaN.

27. The light-emitting diode of claim 25, wherein the first cladding layer is made of at least one material selected from the group consisting of AlGaInP, AlInP, AlN, GaN, AlGaN, InGaN, and AlGaInN.

28. The light-emitting diode of claim 25, wherein the light-emitting layer is made of at least one material selected from the group consisting of AlGaInP, InGaP, GaN, AlGaN, InGaN, and AlGaInN.

29. The light-emitting diode of claim 25, wherein the second cladding layer is made of at least one material selected from the group consisting of AlGaInP, AlInP, AlN, GaN, AlGaN, InGaN, and AlGaInN.

30. The light-emitting diode of claim 25, wherein the second contact layer is made of at least one material selected from the group consisting of GaP, GaAs, GaAsP, InGaP, AlGaInP, AlGaAs, GaN, InGaN, and AlGaN.

* * * * *